(12) United States Patent
Chen et al.

(10) Patent No.: US 9,368,448 B2
(45) Date of Patent: Jun. 14, 2016

(54) METAL-CONTAINING FILMS AS DIELECTRIC CAPPING BARRIER FOR ADVANCED INTERCONNECTS

(71) Applicant: Applied Materials, Inc., Santa Clara, CA (US)

(72) Inventors: Yihong Chen, San Jose, CA (US); Abhijit Basu Mallick, Fremont, CA (US); Mehul B. Naik, San Jose, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/268,727

(22) Filed: May 2, 2014

(65) Prior Publication Data

US 2015/0179581 A1 Jun. 25, 2015

Related U.S. Application Data

(60) Provisional application No. 61/918,973, filed on Dec. 20, 2013.

(51) Int. Cl.
*H01L 23/532* (2006.01)
*H01L 21/768* (2006.01)
*H01L 23/528* (2006.01)

(52) U.S. Cl.
CPC .... *H01L 23/53238* (2013.01); *H01L 21/76802* (2013.01); *H01L 21/76831* (2013.01); *H01L 21/76834* (2013.01); *H01L 21/76879* (2013.01); *H01L 23/5329* (2013.01); *H01L 23/5283* (2013.01); *H01L 2924/0002* (2013.01)

(58) Field of Classification Search
CPC ............... H01L 23/53238; H01L 21/76849; H01L 2224/05624; H01L 2924/01029; H01L 2224/05647
See application file for complete search history.

(56) References Cited

U.S. PATENT DOCUMENTS

| | | | |
|---|---|---|---|
| 6,436,817 B2 * | 8/2002 | Lee | 438/643 |
| 6,620,721 B1 * | 9/2003 | Lee | 438/612 |
| 7,618,889 B2 | 11/2009 | Naik | |
| 7,910,476 B2 | 3/2011 | Fang et al. | |
| 2005/0186801 A1 * | 8/2005 | Uno | H01L 21/3065 438/706 |
| 2007/0099417 A1 | 5/2007 | Fang et al. | |
| 2008/0096380 A1 | 4/2008 | Ko et al. | |
| 2008/0124924 A1 | 5/2008 | Naik | |
| 2008/0280432 A1 * | 11/2008 | Chang | H01L 21/76814 438/627 |

(Continued)

OTHER PUBLICATIONS

PCT Notification of Transmittal of the International Search Report and the Written Opinion of the International Searching Authority for International Application No. PCT/US2014/067254 dated Feb. 25, 2015; 8 total pages.

*Primary Examiner* — Khaja Ahmad
(74) *Attorney, Agent, or Firm* — Patterson & Sheridan, LLP

(57) ABSTRACT

A method is provided for forming an interconnect structure for use in semiconductor devices. The method starts with forming a low-k bulk dielectric layer on a substrate and then forming a trench in the low-k bulk dielectric layer. A liner layer is formed on the low-k bulk dielectric layer being deposited conformally to the trench. A copper layer is formed on the liner layer filling the trench. Portions of the copper layer and liner layer are removed to form an upper surface of the low-k bulk dielectric layer, the liner layer, and the copper layer. A metal containing dielectric layer is formed on the upper surface of the low-k bulk dielectric layer, the liner layer, and the copper layer.

20 Claims, 3 Drawing Sheets

(56) References Cited

U.S. PATENT DOCUMENTS

| | | | |
|---|---|---|---|
| 2009/0137111 A1* | 5/2009 | Lee | H01L 21/76814 438/618 |
| 2011/0223759 A1 | 9/2011 | Wang et al. | |
| 2012/0220057 A1* | 8/2012 | Wang | 438/3 |
| 2013/0005146 A1 | 1/2013 | Balseanu et al. | |
| 2013/0040464 A1 | 2/2013 | Zhou et al. | |
| 2013/0109187 A1 | 5/2013 | Nemani et al. | |

* cited by examiner

US 9,368,448 B2

METAL-CONTAINING FILMS AS DIELECTRIC CAPPING BARRIER FOR ADVANCED INTERCONNECTS

CROSS REFERENCE TO RELATED APPLICATIONS

This application claims benefit of U.S. provisional patent application Ser. No. 61/918,973, filed Dec. 20, 2013, which is herein incorporated by reference.

BACKGROUND

1. Field

Aspects of the present invention relate generally to interconnect structures for use in semiconductor devices and methods for forming such structures.

2. Description of the Related Art

Copper interconnects have become the industry standard since 180 nm CMOS technology nodes because of its high interconnect conductivity and electromigration resistance. However, comparing to other transition metals, copper has much higher diffusivity in silicon-based materials. The rapid diffusion of copper atoms into the surrounding silicon dioxide or other low-k dielectric materials during device operation creates shortcut paths that degrade the dielectric layer and result in device failure. Therefore, the dielectric reliability becomes one of the major concerns in copper interconnect structures. A current solution is to embed the copper interconnect into a tantalum nitride or a tantalum sidewall barrier and enclose the copper interconnect with a silicon-containing dielectric capping layer, such as silicon nitride or silicon carbide. The properties of the capping layer are especially critical since a common failure mechanism for electromigration is through the capping layer.

Making the capping layer thicker to prevent electromigration is not an effective solution as the dielectric constant of capping layer is highest in the metallization stack, which strongly impairs the effective dielectric constant of an interconnect level. Thus, the thickness of the capping layer must be minimized while still maintaining sufficient diffusion-blocking features and good adhesion strength with adjoining layers Manufacturers of semiconductor devices are ever in pursuit of smaller geometries with increased capacity at less cost. As such, the dimensions of interconnect structures and their respective capping layers must be reduced as well. The thickness of silicon-containing dielectric capping layers, such as silicon nitride or silicon carbide layers, has been limited to about 20 nm because it is difficult to ensure the necessary diffusion-blocking properties at thicknesses less than 20 nm. Alternative approaches such as using a selective metal capping barrier or a copper silicon nitride buffer layer between the copper and silicon-containing dielectric capping layer have been proposed. However, such approaches are undesirable due to an increase in interconnect resistance, which reduces device performance.

Therefore, a need exists for improved interconnect structures and methods for forming such structures.

SUMMARY

In one embodiment, a method is provided for forming an interconnect structure for use in semiconductor devices. The method includes forming a low-k bulk dielectric layer on a substrate; forming a trench in the low-k bulk dielectric layer; forming a liner layer on the low-k bulk dielectric layer, the liner layer deposited conformally to the trench, forming a copper layer on the liner layer, wherein the copper layer fills the trench, removing portions of the copper layer and the liner layer to expose an upper surface of the low-k bulk dielectric layer, an upper surface of the liner layer, and an upper surface of the copper layer, and forming a metal containing dielectric layer on the upper surface of the low-k bulk dielectric layer, the upper surface of the liner layer, and the upper surface of the copper layer, wherein the metal containing dielectric layer is a metallic compound selected from the group consisting of metal oxides, metal nitrides and metal oxynitrides In another embodiment, a semiconductor interconnect structure is provided. The interconnect structure includes a substrate, a low-k bulk dielectric layer having a trench formed therein, a liner layer deposited conformally on the low-k bulk dielectric layer within the trench, a copper layer disposed on the liner layer and filling the trench, and a metal containing dielectric layer having a bottom surface contacting the low-k bulk dielectric layer, the liner layer, and the copper layer, wherein the metal containing dielectric layer is a metallic compound selected from the group consisting of metal oxides, metal nitrides and metal oxynitrides.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Interconnect structures used in semiconductor devices and methods for forming such structures are described that provide advantages in blocking copper diffusion. In particular, a metal containing dielectric layer is employed as a capping layer in an interconnect structure to reduce electromigration through the capping layer, thus enabling more robust interconnects at small critical dimensions.

Figure 1:
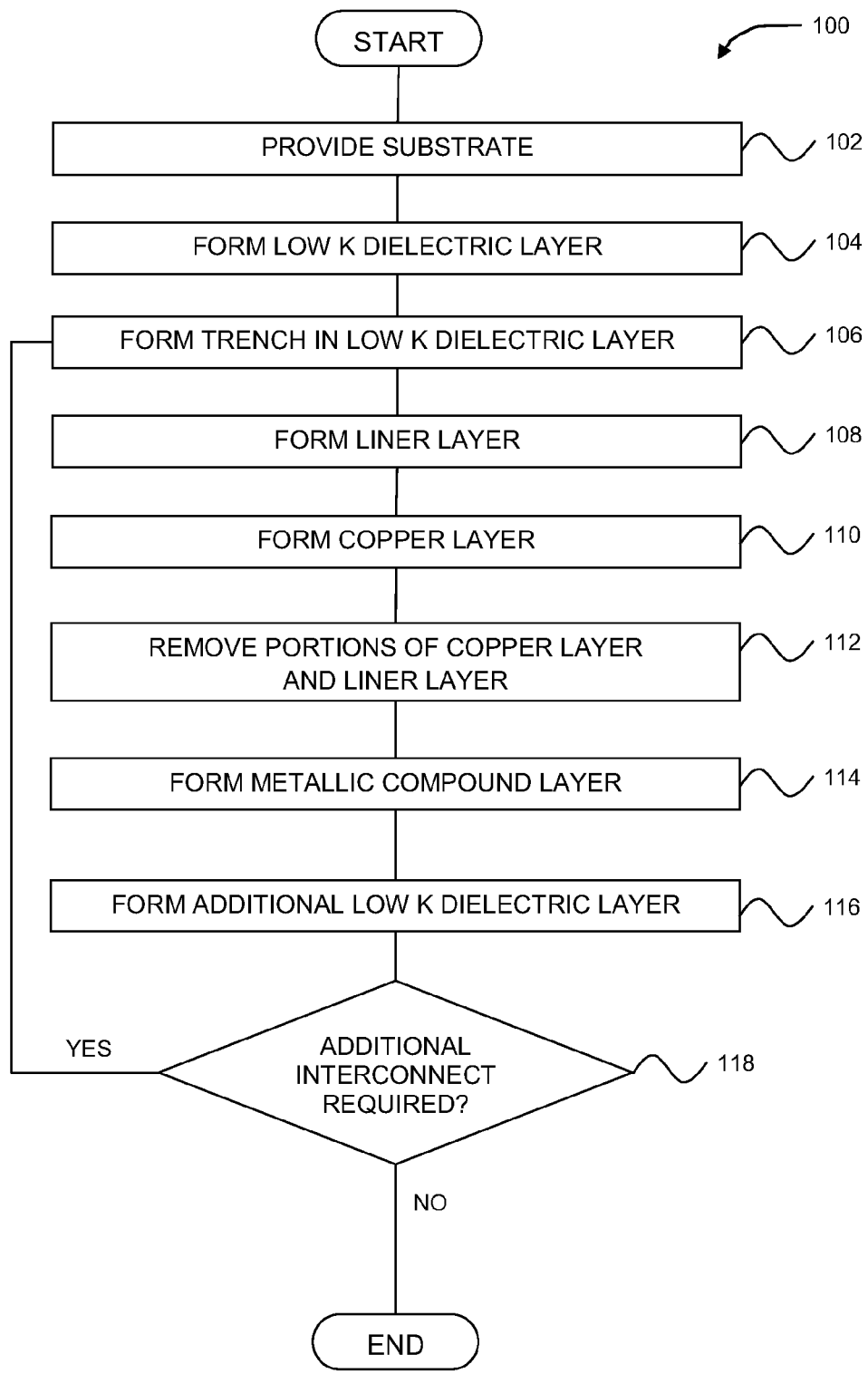
FIG. 1 is a process flow diagram of a process for forming an interconnect structure.
Figure 2A:
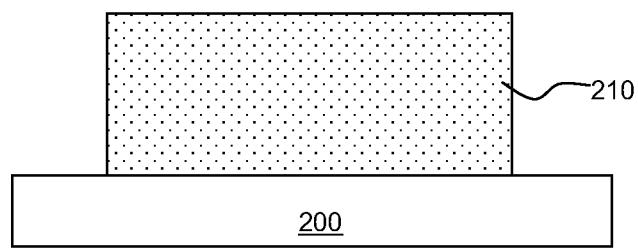
FIGS. 2A-2G illustrate an interconnect structure at different stages of the process of FIG. 1.
Figure 2B:
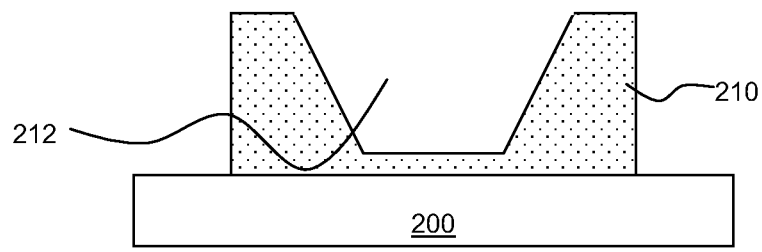
Figure 2C:
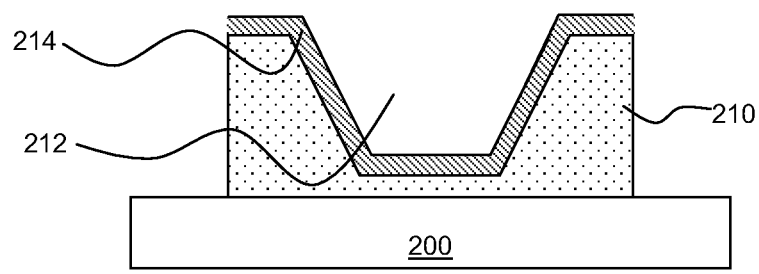
Figure 2D:
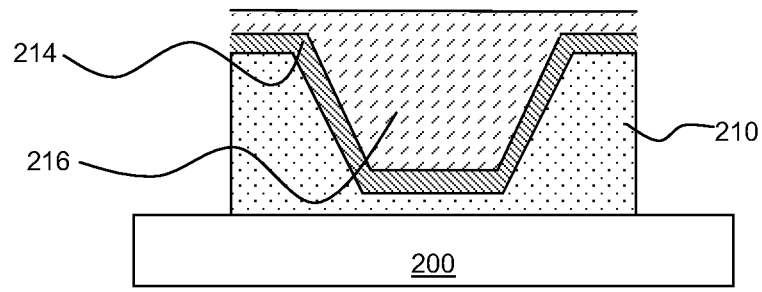
Figure 2E:
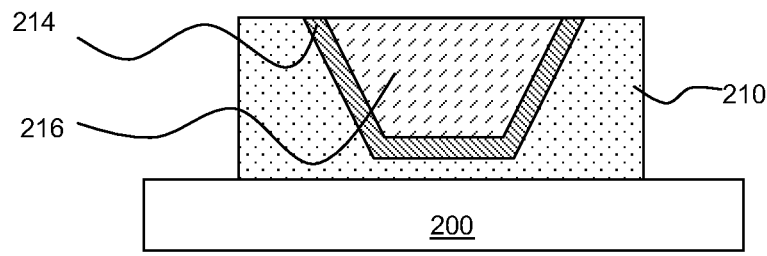
Figure 2F:
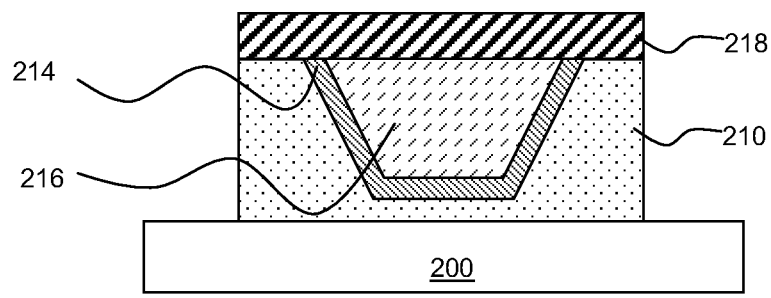
Figure 2G:
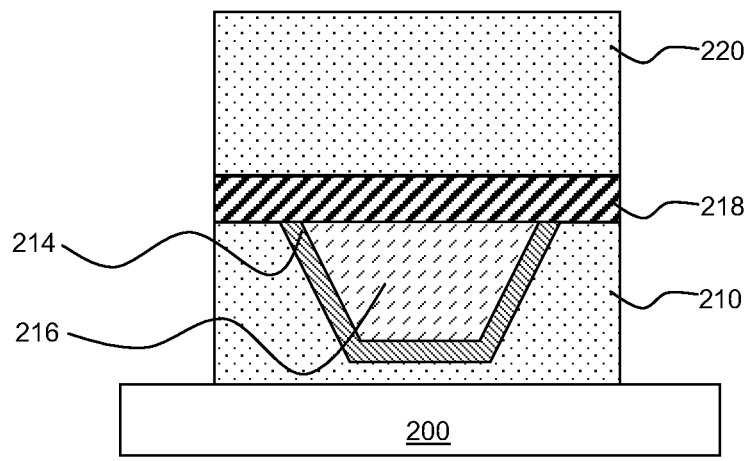

FIG. 1 is a process flow diagram summarizing a process 100 for forming an interconnect structure having a plurality of layers. FIGS. 2A-2G are cross-sectional views of an interconnect structure at different stages of the process 100. At block 102, a substrate 200 is transferred into a processing chamber of a deposition reactor. The deposition reactor may be a chemical vapor deposition (CVD) chamber, a plasma enhanced chemical vapor deposition (PECVD) chamber, an atomic layer deposition (ALD) chamber, or a physical vapor deposition (PVD) chamber, or other chamber suitable for depositing a low-k bulk dielectric layer 210. The substrate 200 provides a surface on which devices may be formed which are selectively connected utilizing the interconnect structure formed thereover. As such, the substrate 200 may be a semiconductor material such as silicon, germanium, or a compound semiconductor, a dielectric material such as glass, ceramic, or plastic, or a conductive material such as aluminum or another metal.

At block 104, a low-k bulk dielectric layer 210 is formed on the substrate 200. The low-k bulk dielectric layer 210 may be deposited to a thickness of at least about 1000 Å. The low-k bulk dielectric layer 210 is formed from a material with a dielectric constant less than that silicon dioxide (or less than about 4.0), such as carbon doped silicon oxides, for example, BLACK DIAMOND® low-k dielectric film, available from Applied Materials, Inc., located in Santa Clara, Calif. Process gases suitable for forming a low-k bulk dielectric layer 210 of BLACK DIAMOND® low-k dielectric film may include octamethylcyclotetrasiloxane (OMCTS), helium, and oxygen. The flowrate of OMCTS may be from about 2000 to sccm to about 3500 sccm, for example about 2700 sccm. The flowrate of helium may be from about 600 sccm to about 1200 sccm, for example about 900 sccm. The flowrate of oxygen may be from about 100 sccm to about 200 sccm, for example about 160 sccm.

In one embodiment a PECVD process is used to form the low k bulk dielectric layer 210, but other deposition methods may be used. The gas mixture provided to the processing chamber to form the low k bulk dielectric layer 210 may be ionized into a plasma after the gas mixture is supplied to the processing chamber. The PECVD process may use high and low frequency RF power. The high frequency RF power may be provided at a power level from about 100 Watts to about 1500 Watts at a frequency between about 1 MHz and about 20 MHz, for example about 13.56 MHz. The low frequency RF power may be provided at a power level from about 0 Watts to about 500 Watts at a frequency between about 200 kHz and about 1 MHz, for example about 350 kHz. The RF power may be cycled or pulsed and may be continuous or discontinuous. During the deposition of the low k bulk dielectric layer 210, the processing chamber of the deposition reactor may be maintained at a temperature between about 200° C. and about 650° C., for example, 350° C., and at a pressure of between about 0.5 Torr and 20 Torr, for example 5 Torr. The spacing between the showerhead and the substrate support pedestal during the deposition of the low k bulk dielectric layer 210 may be between about 200 mils and about 1,000 mils, for example 350 mils.

At block 106, a trench 212 is formed in the low-k bulk dielectric layer 210. Trench 212 may be formed by patterning a photoresist layer on the low-k bulk dielectric layer 210 and using a suitable etching process.

At block 108, a liner layer 214 is formed on the low-k bulk dielectric layer 210. The liner layer 214 is also conformally deposited to the trench 212. The liner layer 214 may be deposited to a thickness of about 0.5 Å to about 20 Å. The liner layer 214 may be a layer of tantalum, tantalum nitride, ruthenium, or other suitable material. In some embodiments an ALD or PVD process is used to form the liner layer 214, but other deposition methods may be used.

At block 110, a copper layer 216 is formed on the liner layer 214. The copper layer 216 fills the trench 212 and may overlay a portion of the low-k bulk dielectric layer 210. The copper layer 216 may be deposited by any suitable technique. For example, a portion of the copper layer 216 may be deposited by using ALD or PVD to form a copper seed layer, and then the remainder of the copper layer 216 is formed by a plating process.

At block 112, portions of the copper layer 216 and the liner layer 214 are removed to expose an upper surface of the low-k bulk dielectric layer 210, an upper surface of the liner layer 214, and an upper surface of the copper layer 216. Chemical mechanical polishing may be used to remove the portions of the copper layer 216 and the liner layer 214. After block 112, the upper surfaces of the low-k bulk dielectric layer 210, the liner layer 214, and the copper layer 216 may be substantially coplanar.

At block 114, a metal containing dielectric layer 218 is formed on the upper surface of the low-k bulk dielectric layer 210, the upper surface of the liner layer 214, and the upper surface of the copper layer 216. The metal containing dielectric layer 218 may be a metallic dielectric compound selected from the group consisting of metal oxides, metal nitrides, and metal oxynitrides.

Examples of metal oxides that may be used as the metal containing dielectric layer 218 include aluminum oxide, zinc oxide, magnesium oxide, nickel oxide, hafnium oxide, zirconium oxide, tantalum oxide, titanium oxide, copper oxide, cerium oxide and their non-stoichiometric forms or combinations. The metal oxide may be deposited by use of ALD, CVD, or PVD, spin-on techniques, or other suitable techniques.

In one embodiment, aluminum oxide is used as the metal containing dielectric layer 218. The aluminum oxide layer may be formed through ALD by using trimethylaluminum (TMA) and water as the precursors. Alternatively, a plasma enhanced process may be used to form the aluminum oxide layer by using TMA and oxygen as the precursors.

In another embodiment, magnesium oxide is used as the metal containing dielectric layer 218. The magnesium oxide layer may be formed through ALD by using diethyl magnesium, bis(cylcopentadienyl) magnesium, or bis(ethylcyclopentadienyl) magnesium as the first precursor and water as the second precursor.

Examples of metal nitrides that may be used as the metal containing dielectric layer 218 include aluminum nitride, titanium nitride, and zirconium nitride. In one embodiment, aluminum nitride is used as the metal containing dielectric layer 218. The aluminum nitride layer may be formed through a plasma enhanced ALD process by using TMA and ammonia as the precursors.

Aluminum oxynitride is an exemplary metal oxynitride that may be used for the metal containing dielectric layer 218. An aluminum oxynitride layer may be formed using TMA, ammonia and water as the precursors.

The thickness of the metal containing dielectric layer 218 may be less than about 20 nm, for example about 5 nm. In some embodiments the thickness of the metal containing dielectric layer 218 may be between about 0.5 nm and about 1.0 nm, for example about 0.7 nm.

In some embodiments, metallic dielectric compounds with a dielectric constant less than 12 and a dielectric strength between 5 MV/cm and 20 MV/cm are used as the metal containing dielectric layer 218. Metallic dielectric compounds with such a combination of dielectric constant and dielectric strength can perform as an effective capping layer for copper interconnects at thicknesses of less than 1 nm, for example 0.5 nm.

At block 116, an additional low-k bulk dielectric layer 220 is formed on the metal containing dielectric layer 218. The additional low-k bulk dielectric layer 220 may be formed according to a process similar to that described above in connection with forming the low-k bulk dielectric layer 210.

If additional interconnects are required on substrate 200, then the process of forming a trench 212 in the low-k bulk dielectric layer 210, forming a liner layer 214 on the low-k bulk dielectric layer 210, forming a copper layer 216 on the liner layer 214 filling the trench 212, removing portions of the copper layer 216 and the liner layer 214 layer to expose an upper surface of the low-k bulk dielectric layer 210, an upper surface of the liner layer 214, and an upper surface of the copper layer 216, forming a metal containing dielectric layer 218 on the upper surface of the low-k bulk dielectric layer 210, the upper surface of the liner layer 214, and the upper surface of the copper layer 216, and forming an additional low-k bulk dielectric layer 220 on the metal containing dielectric layer 218 may be repeated as illustrated by decision operation 118. Any number of interconnects may be provided by repeating the process any desired number of times.

While the foregoing is directed to embodiments of the present invention, other and further embodiments of the invention may be devised without departing from the basic scope thereof, and the scope thereof is determined by the claims that follow.

The invention claimed is:

1. A method for forming an interconnect structure, the method comprising:
    (a) forming a low-k bulk dielectric layer on a substrate;
    (b) forming a trench in the low-k bulk dielectric layer;
    (c) forming a liner layer on the low-k bulk dielectric layer, the liner layer deposited conformally to the trench;
    (d) forming a copper layer on the liner layer, wherein the copper layer fills the trench;
    (e) removing portions of the copper layer and the liner layer to expose an upper surface of the low-k bulk dielectric layer, an upper surface of the liner layer, and an upper surface of the copper layer; and
    (f) forming a metal containing dielectric layer on the upper surface of the low-k bulk dielectric layer, the upper surface of the liner layer, and the upper surface of the copper layer, wherein the metal containing dielectric layer is a metallic compound selected from a group consisting of aluminum nitride, titanium nitride, and zirconium nitride, wherein the metal containing dielectric layer is a material with a dielectric constant less than 12 and a dielectric strength greater than 8 MV/cm.

2. The method of claim 1 further comprising:
    (g) forming a second low-k bulk dielectric layer on the metal containing dielectric layer; and
    (h) repeating steps (b) through (f).

3. The method of claim 1, wherein a thickness of the metal containing dielectric layer is 20 nm or less.

4. The method of claim 1, wherein a thickness of the metal containing dielectric layer is 5 nm or less.

5. The method of claim 1, wherein a thickness of the metal containing dielectric layer is within a range of about 0.5 nm to about 1 nm.

6. The method of claim 1, wherein the metal containing dielectric layer is titanium nitride.

7. The method of claim 1, wherein the metal containing dielectric layer is zirconium nitride.

8. The method of claim 1, wherein the metal containing dielectric layer is aluminum nitride.

9. The method of claim 6, wherein a thickness of the metal containing dielectric layer is within a range of about 0.5 nm to about 1 nm.

10. A semiconductor interconnect structure comprising:
    a substrate;
    a low-k bulk dielectric layer having a trench formed therein;
    a liner layer deposited conformally on the low-k bulk dielectric layer within the trench;
    a copper layer disposed on the liner layer and filling the trench; and
    a metal containing dielectric layer having a bottom surface contacting the low-k bulk dielectric layer, the liner layer, and the copper layer, wherein the metal containing dielectric layer is a metallic compound selected from a group consisting of aluminum nitride, titanium nitride and zirconium nitride, wherein the metal containing dielectric layer is a material with a dielectric constant less than 12 and a dielectric strength greater than 8 MV/cm.

11. The structure of claim 10 further comprising:
    a second low-k bulk dielectric layer having a trench formed therein;
    a second liner layer deposited conformally on the second low-k bulk dielectric layer within the trench;
    a second copper layer disposed on the second liner layer and filling the trench formed in the second low-k bulk dielectric layer; and
    a second metal containing dielectric layer having a bottom surface contacting the second low-k bulk dielectric layer, the second liner layer, and the second copper layer, wherein the second metal containing dielectric layer is a metallic compound selected from a group consisting of aluminum nitride, titanium nitride, and zirconium nitride.

12. The structure of claim 10, wherein a thickness of the metal containing dielectric layer is 20 nm or less.

13. The structure of claim 10, wherein a thickness of the metal containing dielectric layer is 5 nm or less.

14. The structure of claim 10, wherein a thickness of the metal containing dielectric layer is within a range of about 0.5 nm to about 1 nm.

15. The structure of claim 10, wherein the metal containing dielectric layer is titanium nitride.

16. The structure of claim 15, wherein a thickness of the metal containing dielectric layer is 5 nm or less.

17. The structure of claim 15, wherein a thickness of the metal containing dielectric layer is within a range of about 0.5 nm to about 1 nm.

18. A semiconductor interconnect structure comprising:
    a substrate;
    a low-k bulk dielectric layer having a trench formed therein;
    a liner layer deposited conformally on the low-k bulk dielectric layer within the trench;
    a copper layer disposed on the liner layer and filling the trench; and
    a metal containing dielectric layer having a bottom surface contacting the low-k bulk dielectric layer, the liner layer, and the copper layer, wherein the metal containing dielectric layer comprises zirconium nitride, wherein the metal containing dielectric layer is a material with a dielectric constant less than 12 and a dielectric strength greater than 8 MV/cm.

19. The structure of claim 10, wherein the metal containing dielectric layer is aluminum nitride.

20. The structure of claim 10, wherein the metal containing dielectric layer is zirconium nitride.

* * * * *